United States Patent

Minner et al.

[15] 3,636,455

[45] Jan. 18, 1972

[54] TUNABLE INPUT CIRCUIT

[72] Inventors: Willy Minner, Ingolstadt; Gerhard Lindner, Pfaffenhofen, both of Germany

[73] Assignee: Telefunken Patentverwertungsgesellschaft m.b.H., Ulm am Danube, Germany

[22] Filed: Sept. 29, 1969

[21] Appl. No.: 861,924

[30] Foreign Application Priority Data

Sept. 27, 1968 Germany ......................P 17 91 182.9

[52] U.S. Cl. ..............................325/379, 325/388, 325/477, 333/70 A, 333/75

[51] Int. Cl. ........................................H03h 7/10, H04b 1/18

[58] Field of Search ................325/379, 388, 477; 333/70 A, 333/74–76

[56] References Cited

UNITED STATES PATENTS 3,192,491 6/1965 Hesselberth et al. ....................333/17

FOREIGN PATENTS OR APPLICATIONS 245,183 1/1926 Great Britain........................325/379

*Primary Examiner*—Robert L. Richardson
*Attorney*—Spencer & Kaye

[57] ABSTRACT

A tunable input circuit with high selectivity for feeding a signal to a variable-frequency band-pass filter with tuning elements identical to those of the input circuit. The high selectivity produced by the input circuit is a minimum in the range of the received frequency and a maximum in the range of the image frequency. The input circuit is a bridge having four arms with impedances in them and four points connecting the arms. The impedances are diagonally matched, and one set is variable. One set of diagonally opposite points connecting the arms is connected between an antenna lead and ground. A voltage-variable capacitance (such as a voltage-variable diode) is connected between the other pair of connecting points. A tuning voltage is fed back to the voltage-variable capacitance means. This voltage is preferably the same voltage used to tune the band-pass filter.

11 Claims, 6 Drawing Figures

Inventors.
Willy Minner
Gerhard Lindner
BY Spencer & Kaye
ATTORNEYS.

INVENTORS.
Willy Minner
Gerhard Lindner

BY Spencer & Kaye
ATTORNEYS.

TUNABLE INPUT CIRCUIT

BACKGROUND OF THE INVENTION

The present invention relates to a tunable input circuit with high selectivity, intended to feed a signal into a variable-frequency band-pass filter employing tuning elements identical to those of the input circuit. The selectivity produced by the attenuation is a minimum in the range of the received frequency and a maximum in the range of the image frequency.

It is known to produce a synchronous attenuation peak for a variable-frequency band-pass filter in which two parallel, oscillating circuits are connected in series-parallel with the input of a mixer stage. In one of these parallel circuits one parallel branch is formed by a variable inductance and the other by a variable capacitance, whereas the other parallel, oscillating circuit contains a fixed inductance and a variable capacitor for varying the synchronization.

SUMMARY OF THE INVENTION

It is an object of the present invention to provide a synchronous attenuation peak by means of a voltage-dependent capacitance. The previous circuits are not suited for this because the voltage-dependent capacitance devices presently on the market still exhibit a relatively high series resistance, and thus reduce the quality of the circuit. It is therefore an object of the present invention to provide a circuit which makes it possible to obtain synchronization of the attenuation peak over a wide frequency range.

This is achieved according to the present invention by constructing the input circuit as a bridge circuit. One of the bridge diagonal points is connected to a 60-ohm antenna lead and the opposite diagonal point is connected to ground. A voltage-dependent capacitance is connected between the other pair of bridge diagonal points. The bridge arms are provided with inductances; the inductances which are diagonally opposed being of identical size. The same voltage-dependent capacitance is used as is employed in the band filter and oscillator circuits to which the input circuit is connected. This makes it possible to pass through the entire frequency range with the same tuning voltage and thus to always maintain the attenuation peak at the same distance. This makes it possible, for example, to improve the image selection stability, which in the UHF range is approximately 70 MHz. above the received frequency, by about 15 db.

DESCRIPTION OF THE PREFERRED EMBODIMENTS

Figure 1:
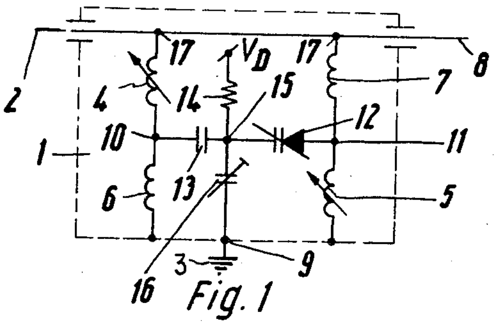
FIG. 1 shows a bridge circuit according to the present invention.

The total structure of the selection stage is indicated by the numeral 1. The input signal comes through wire 2, which wire, or lead, may be the usual 60-ohm wire. When a 60-ohm wire is used, it is particularly necessary to achieve a minimum transducer loss for the desired HF signals. The selection stage according to the present invention consists of a four-arm bridge circuit. In one pair of diagonally opposed arms of the bridge are equal-sized trimmer inductances 4 and 5; and in each of the other pair of diagonally opposed bridge arms there is an equal-sized fixed inductance 6 and 7. The adjustable trimmer inductances 4 and 5 preferably consist of two parallel conductors, such as wires, which can be bent toward and away from each other for setting the amount of the inductance. These conductors serve to determine the position of the frequency deviation. The output signal is led along wire, or lead, 8 connected to the bridge at the same point 17 as the input signal 2, whereas the other diagonal bridge point 9 is connected to ground 3. A voltage-dependent capacitance, preferably a variable capacitance diode 12, is provided between the other two bridge diagonal points 10 and 11. This diode is preferably in series with a shifting capacitance 13 which serves to set the capacitance deviation of the voltage-variable capacitance diode 12, and which in turn determines the tunable frequency deviation. The tuning voltage $V_D$ is inserted between the capacitance diode 12 and the shifting capacitance 13, preferably through a high-ohmic resistor 14.

The tuning voltage $V_D$ is preferably the same voltage that serves to tune the further circuits, e.g., the band filter and oscillator circuits of an input element for television instruments. From connection point 15 between the variable capacitance diode 12 and the shifting capacitance 13 a trimmer capacitor 16 is preferably connected to ground.

Figure 2:
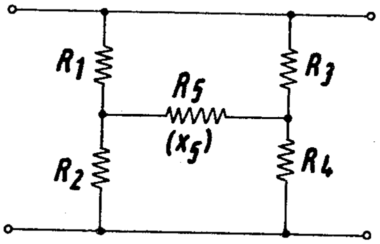
FIGS. 2 and 3 show equivalent circuit diagrams corresponding to the circuit of FIG. 1.

The equivalent circuit diagram shown in FIG. 2 for the selection stage according to FIG. 1 results in the following computation of the input impedance $Z_E$:

$$Z_E=\frac{R_1R_2(R_3+R_4)+R_3R_4(R_1+R_2)+R_5(R_1+R_2)(R_3+R_4)}{(R_1+R_3)(R_2+R_4)+R_5(R_1+R_2+R_3+R_4)}$$

If the reactances of the equivalent elements of the circuit are set equal to symbols $R$, the complex input impedance $Z_E$ of the given circuit results in:

$$R_1\rightarrow jX_1=j\omega L_1 \quad R_3\rightarrow jX_3=j\omega L_3$$
$$R_2\rightarrow jX_2=j\omega L_2 \quad R_4\rightarrow jX_4=j\omega L_4$$
$$R_5\rightarrow R+jX_5=R-j\frac{1}{\omega C}$$

The ohmic component $R$ in the bridge diagonal arm describes the series impedances of the voltage-variable capacitance diode.

This gives for the input impedance:

$$Z_E=\frac{R(X_1+X_2)(X_3+X_4)+j[X_5(X_1+X_2)(X_3+X_4)+X_1X_2(X_3+X_4)+X_3X_4(X_1+X_2)]}{(X_1+X_3)(X_2+X_4)+X_5(X_1+X_2+X_3+X_4)-jR(X_1+X_2+X_3+X_4)}$$

Figure 3:
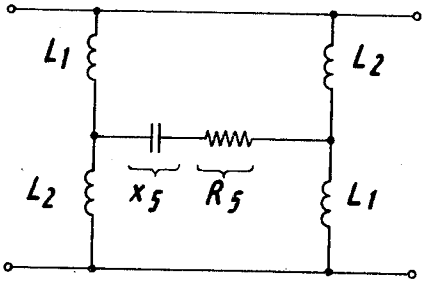

By means of practical and mathematical experiments made in the course of perfecting the concept, it has been found that only one diagonally symmetrical arrangement produces the desired characteristics. The corresponding equivalent circuit diagram is shown in FIG. 3.

The expression for the input impedance $Z_E$ is simplified in the following manner:

$$Z_E=\frac{R(X_1+X_2)^2+j[X_5(X_1+X_2)^2+2X_1X_2(X_1+X_2)]}{(X_1+X_2)^2+2X_5(X_1+X_2)-j2R(X_1+X_2)}$$

By expanding the fraction with the conjugated complex value of the denominator, the real component of the input impedance is:

$$Re(Z_E)=\frac{R(X_1+X_2)^2-4X_1X_2}{(X_1+X_2)^2+4X_5(X_1+X_2)+4X_5^2}$$

and the imaginary component is:

$$Im(\underline{Z_E}) = \frac{X_5(X_1+X_2)^2+2(X_1X_2)(R^2+X_5^2+X_1X_2)+4X_1X_2X_5}{(X_1+X_2)^2+4X_5(X_1+X_2)+4(X_5^2+R^2)}$$

In order to find the parallel and series resonant points for the circuit arrangement, the imaginary component is set equal to zero. By assuming values for $X_1$, $X_2$ and $R$, the value (or values) of $X_5$ is determined where the imaginary component becomes zero. Since this always corresponds to a certain resonance, the resonant frequencies are also known. By solving the quadratic equation which results when the numerator of the imaginary component is set equal to zero, the following two equations are found for $X_5$:

$$X_{51} = -\frac{2X_1X_2}{X_1+X_2}$$

$$X_{52} = -\frac{X_1+X_2}{2}$$

When these values are entered in the equation for $Re(Z_E)$, it can be seen that $X_{51}$ represents the series resonance and $X_{52}$ the parallel resonance since $Re(Z_E)$ in the first case takes on a minimum, whereas in the second case it goes to infinity.

$$Re_1(\underline{Z_E}) = \frac{R}{1-\frac{4X_1X_2}{(X_1+X_2)^2}} : Re_2 = \infty$$

The positions of the resonant frequencies are obtained as follows:

Parallel resonance:

$$X_5 = -\frac{X_1+X_2}{2} \rightarrow \frac{1}{\omega C} = \frac{\omega L_1+\omega L_2}{2};\ \omega_p^2 = \frac{2}{C(L_1+L_2)}$$

Series resonance:

$$X_5 = -\frac{2X_1X_2}{X_1+X_2} \rightarrow \frac{1}{\omega C} = \frac{2\omega^2 L_1L_2}{\omega(L_1+L_2)};\ \omega_s^2 = \frac{1}{2C\frac{L_1L_2}{L_1+L_2}}$$

If the square of the frequency ratio is considered, it can be seen that it is independent of $C$.

$$\left(\frac{\omega_p}{\omega_s}\right)^2 = \frac{2}{C(L_1+L_2)} \cdot \frac{2CL_1L_2}{L_1+L_2} = \frac{4L_1L_2}{(L_1+L_2)^2}$$

$$\frac{f_p}{f_s} = \frac{\sqrt{L_1L_2}}{\frac{(L_1+L_2)}{2}}$$

The frequency ratio is the quotient of the arithmetic and geometric means of the two inductance values.

Figure 5:
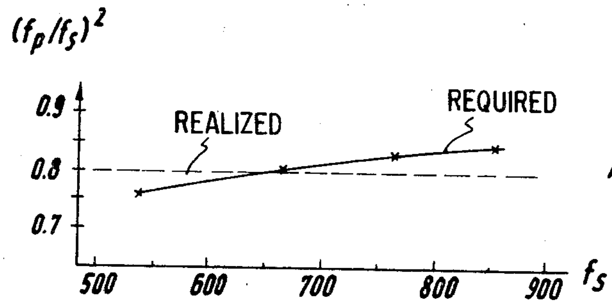
FIG. 5 shows the relationship of a ratio of the frequencies of the parallel circuit and the series circuit in dependence on the frequency range to be tuned.

For tuning in the UHF range this means that the synchronism between peak and zero attenuation can not be optimally designed for the entire range. Its influence remains sufficiently low, however, if the tuning deviation from the shifting capacitance 13 and the upper or lower limit, respectively, are fixed by means of the trimmer capacitor 16 and the inductance $L_2$. The graph of FIG. 5 shows the required frequency ratio $(f_p/f_s)^2$ in comparison with the resulting ratio in the entire UHF range. The individual values are as follows:

| $f_s$ | $(f_p/f_s)^2$ |
|---|---|
| 540 | 0.76 |
| 670 | 0.80 |
| 770 | 0.83 |
| 860 | 0.845 |

If a mean frequency ratio of $(f_p/f_s)^2=0.8$ is assumed, the required inductance ratio $(L_1/L_2)$ can be calculated as follows:

$$\left(\frac{f_p}{f_s}\right)^2 = \frac{4L_1L_2}{(L_1+L_2)^2} = \frac{4\left(\frac{L_1}{L_2}\right)}{1+2\left(\frac{L_1}{L_2}\right)+\left(\frac{L_1}{L_2}\right)^2}$$

Simplified, this is:

$$\frac{4x}{1+2x+x^2} = 0.8$$

The solutions: $X_1=2.62$ and $X_2=0.37$ are reciprocal values. It thus follows:

$$\| L_2 = 2.62 \cdot L_1 \|$$

In practice, this ratio is realized by $L_2$ being constructed as a fixed inductance (3 turns at a diameter of 3 mm.) and $L_1$ as a variable inductance in the form of two parallel wire bows. This makes it possible to exactly tune the series and parallel resonance to each other at $f_e=600$ MHz. ($f_s=670$). In the embodiment shown in FIG. 1, the capacitance of the shifting capacitance 13 was approximately 10 pF, that of the trimmer capacitor 16 was from 1 to 2 pF, the diode 12 was a BB105*a*, the resistor 14 had a value of 56 kΩ.

Attenuation of the series resonant point is as follows:

Starting with $$Re(\underline{Z_E}) = R \cdot \frac{4L_1L_2}{(L_1+L_2)^2} = R \cdot \frac{(L_1+L_2)^2}{(L_1-L_2)^2}$$

and employing the inductance ratio $L_1/L_2$ as determined above, an input resistance results as follows:

$$Re(\underline{Z_E}) = R \cdot (3.62/1.62)^2$$

$$Re(\underline{Z_E})\ \text{series} = R \cdot 2.23^2 = 5R$$

With the conventional value for the series resistance of $R=0.6$ ohm, $Re(Z_E)_s=3$ ohm.

The resulting voltage attenuation is:

$V_u=(60 \cdot 60/120) \cdot (1/3)=10$ $d_{u[db]} = \underline{20} \cdot \log V_u$ and thus $d_u \triangleq 20$ db.

In practice, if a transducer loss of $A_D=1$ db. is permissible, an additional image attenuation of $dp \geqq 15$ db. over the entire range can be realized when a quartet of diodes is used for tuning and selection four-pole, and when the construction of the circuit is optimum.

Figure 4:
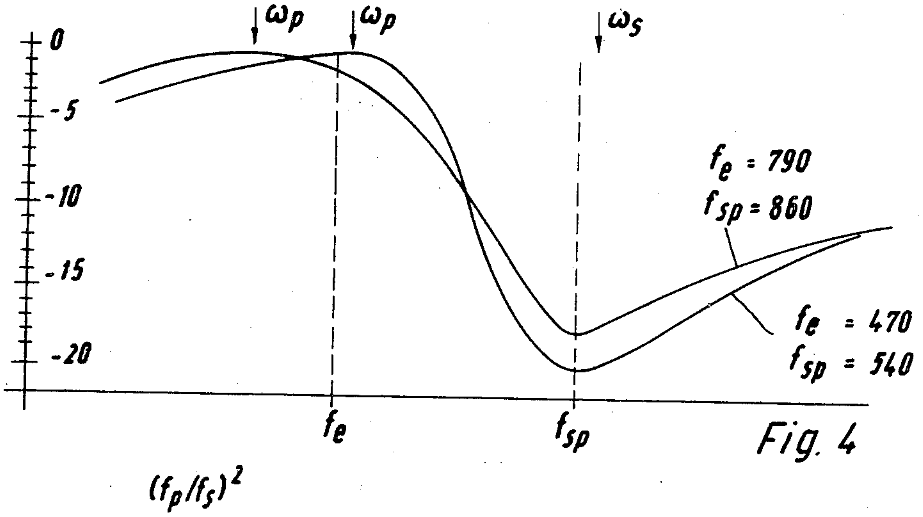
FIG. 4 shows associated attenuation curves.

FIG. 4 shows the band-pass attenuation of the quadripole as a function of the input frequency which is electronically variable and adjustable by the capacitance diode 12. The full lined curve of the diagram of FIG. 4 shows the progress at an input frequency of 470 MHz. in which case the image frequency $f_{sp}=470+70=540$ MHz. is damped about +20 db., while the dotted line shows the progress at an input frequency of 790 MHz., the image frequency being $f_{sp}=790+70=860$ MHz.

It will be understood that the above description of the present invention is susceptible to various modifications, changes and adaptations.

Figure 6:
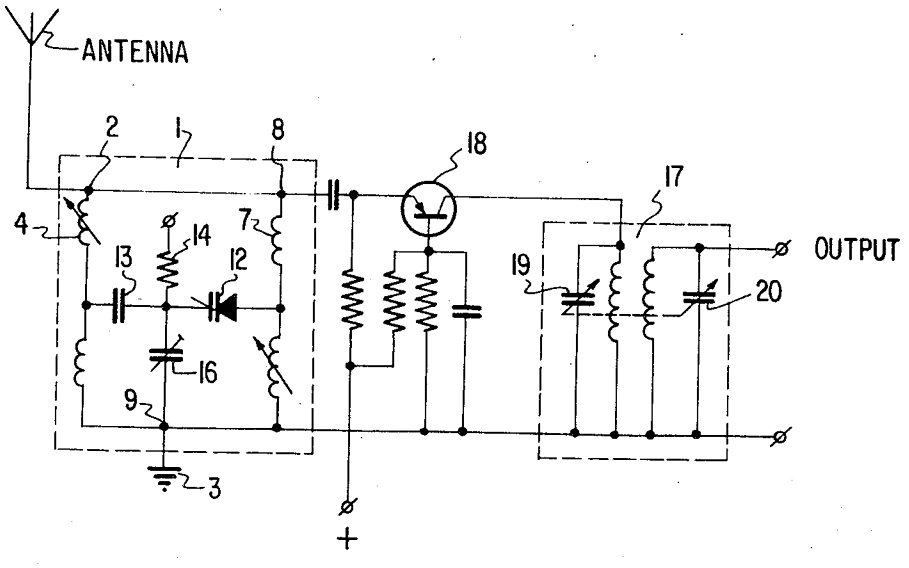
FIG. 6 shows another bridge circuit according to the present invention.

In FIG. 6 there is shown an example in which the input circuit 1 according to the invention is separated from a following band-pass filter 17 by an active element 18 which in this case is a PNP-transistor. The band-pass filter 17 is tunable over the entire received frequency range by means of the coupled variable capacitors 19, 20 in the primary and secondary band-pass circuit. These variable capacitors 19, 20 may be advantageously replaced by capacitance diodes.

The separating of the input circuit 1 from the bandpass 17 by the active element 18 has the effect that the reaction from the band-pass filter 17 to the input circuit 1 and contrariwise can be avoided nearly completely.

We claim:

1. A tunable input circuit for producing an attenuation which is a minimum in the range of a received frequency and a maximum in the range of an image frequency, comprising, in combination:

a. four arms connected as a bridge so that there are two pairs of opposite arms and two pairs of diagonally opposite connecting points, each arm of said bridge including inductance means, the inductance means of each arm being equal in value to the inductance means included in the opposite arm;

b. voltage-variable capacitance means connected across one pair of said two pairs of connecting points for providing a synchronous attenuation peak; and c. an input lead and an output lead connected to one connecting point of the other of said two pairs of connecting points, the other connecting point of the other of said two pairs of connecting points connected to ground.

2. An input circuit as defined in claim 1 wherein a shifting capacitance means is connected in series with said voltage-variable capacitance means for setting the capacitance deviation of said voltage-variable capacitance means.

3. An input circuit as defined in claim 2 wherein a control voltage is applied between said voltage-variable capacitance means and said shifting capacitance means to bias said voltage-variable capacitance means.

4. An input circuit as defined in claim 3 wherein a trimmer capacitor is connected between a point between said voltage-dependent capacitance means and said shifting capacitance means and ground for fixing of the tuning deviation from said shifting capacitance means and a frequency range limit.

5. An input circuit as defined in claim 4 wherein two of said diagonally opposite inductance means are variable inductors for determining the position of the frequency deviation.

6. An input circuit as defined in claim 5 wherein said variable inductors are two parallel wire bows which can be bent with respect to each other.

7. An input circuit as defined in claim 6 wherein said voltage-variable capacitance means is a voltage-variable diode.

8. An input circuit as defined in claim 7 wherein said input lead is a 60-ohm wire.

9. An input circuit as defined in claim 1 wherein a control voltage is applied between said one of said pairs of points to bias said voltage-variable capacitance means.

10. An input circuit as defined in claim 1 wherein said input circuit is the input circuit for a tunable band-pass filter in a tuning assembly for a communications receiver, said filter having tuning elements identical to those of said input circuit.

11. An input circuit as defined in claim 10 wherein the input circuit is coupled with the tunable band-pass filter by means of an active element.

* * * * *